(12) United States Patent
Sriram

(10) Patent No.: US 7,326,962 B2
(45) Date of Patent: Feb. 5, 2008

(54) TRANSISTORS HAVING BURIED N-TYPE AND P-TYPE REGIONS BENEATH THE SOURCE REGION AND METHODS OF FABRICATING THE SAME

(75) Inventor: Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 356 days.

(21) Appl. No.: 11/012,553

(22) Filed: Dec. 15, 2004

(65) Prior Publication Data

US 2006/0125001 A1 Jun. 15, 2006

(51) Int. Cl.
*H01L 29/04* (2006.01)

(52) U.S. Cl. .................. 257/77; 257/280; 257/284; 327/431; 438/167

(58) Field of Classification Search ........... 438/259, 438/284, 167; 257/E21.452, E29.321, 77, 257/192, 284, 287, 167, E21.066, E21.451, 257/E29.104, E29.317; 327/431
See application file for complete search history.

(56) References Cited

U.S. PATENT DOCUMENTS

| | | | |
|---|---|---|---|
| 3,903,592 | A | 9/1975 | Heckl |
| 4,732,871 | A | 3/1988 | Buchmann et al. |
| 4,737,469 | A | 4/1988 | Stevens |
| 4,757,028 | A | 7/1988 | Kondoh et al. |
| 4,762,806 | A | 8/1988 | Suzuki et al. |
| 4,803,526 | A | 2/1989 | Terada et al. |
| 4,897,710 | A | 1/1990 | Suzuki et al. |
| 4,947,218 | A | 8/1990 | Edmond et al. |
| 5,229,625 | A | 7/1993 | Suzuki et al. |
| 5,264,713 | A | 11/1993 | Palmour |
| 5,270,554 | A | 12/1993 | Palmour |
| 5,289,015 | A | 2/1994 | Chirovsky et al. |
| 5,300,795 | A | 4/1994 | Saunier et al. |

(Continued)

FOREIGN PATENT DOCUMENTS

DE 19900169 7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner*—Matthew Smith
*Assistant Examiner*—Su C. Kim
(74) *Attorney, Agent, or Firm*—Myers Bigel Sibley & Sajovec PA

(57) ABSTRACT

The present invention provides a unit cell of a metal-semiconductor field-effect transistor (MESFET). The unit cell of the MESFET includes a source, a drain and a gate. The gate is disposed between the source and the drain and on an n-type conductivity channel layer. A p-type conductivity region is provided beneath the source and has an end that extends towards the drain. The p-type conductivity region is spaced apart from the n-type conductivity channel region and is electrically coupled to the source. An n-type conductivity region is provided on the p-type conductivity region beneath the source region and extending toward the drain region without extending beyond the end of the p-type conductivity region. Related methods of fabricating MESFETS are also provided.

48 Claims, 8 Drawing Sheets

U.S. PATENT DOCUMENTS

| | | | |
|---|---|---|---|
| 5,306,650 | A | 4/1994 | O'Mara, Jr. et al. |
| 5,396,085 | A | 3/1995 | Baliga |
| 5,399,883 | A | 3/1995 | Baliga |
| 5,510,630 | A | 4/1996 | Agarwal et al. |
| 5,686,737 | A | 11/1997 | Allen |
| 5,719,409 | A | 2/1998 | Singh et al. |
| 5,742,082 | A | 4/1998 | Martinez et al. |
| 5,869,856 | A | 2/1999 | Kasahara |
| 5,891,769 | A | 4/1999 | Liaw et al. |
| 5,895,939 | A | 4/1999 | Ueno |
| 5,900,648 | A | 5/1999 | Harris et al. |
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,686,616 | B1 | 12/2004 | Allen et al. |
| 2003/0017660 | A1 | 1/2003 | Li |
| 2003/0075719 | A1* | 4/2003 | Sriram ........................ 257/77 |
| 2004/0099888 | A1 | 5/2004 | Sriram |

FOREIGN PATENT DOCUMENTS

| | | |
|---|---|---|
| EP | 0 305 975 A | 3/1989 |
| EP | 0518 683 A1 | 12/1992 |
| JP | 47-5124 | 3/1972 |
| JP | 54-155482 | 10/1979 |
| JP | 59134874 | 8/1984 |
| JP | 60-142568 | 7/1985 |
| JP | 60-154674 | 8/1985 |
| JP | 60-189250 | 9/1985 |
| JP | 63-47983 | 2/1988 |
| JP | 64-59961 | 3/1989 |
| JP | 1-106476 | 4/1989 |
| JP | 1-196873 | 8/1989 |
| JP | 1-308876 | 12/1989 |
| JP | 2-10772 | 1/1990 |
| JP | 4-4225534 | 8/1992 |
| JP | 9-36359 | 2/1997 |
| JP | 11-150124 | 6/1999 |
| WO | WO 98/19342 | 5/1998 |
| WO | WO 01/86727 | 11/2001 |

OTHER PUBLICATIONS

Allen, *Silicon Carbide MESFET's with 2W/mm and 50% P.A.E. at 1.8 GHz*, 1996.

Browne, Editorial: *The Power and the Glory*, Microwaves & RF, Jul. 1999, p. 17.

Browne, *SiC MESFET Delivers 10-W Power at 2GHZ*, Microwaves & RF, Oct. 1999, pp. 138-139.

Browne, *Top Products of 1999*, Microwaves &RF, Dec. 1999, pp. 223-233.

Carter et al., *Silicon Carbide and Related Materials, 1999, Part 2, Materials Science Forum*, vols. 338-342, pp. 1247-1266 (2000).

Evwaraye et al., "Examination of Electrical and Optical Properties of Vanadium in Bulk n-Type Silicon Carbide," *J. Appl. Phys.* vol. 76, No. 10, 1994.

*First Silicon Carbide Microwave Power Products Are Introduced*, Applied Microwave & Wireless, pp. 104.

Heftman, *Wireless Semi Technology Heads Into New Territory*, Microwaves & RF, Feb. 2000, pp. 31-38.

Hilton et al., *Suppression of Instabilities in 4H-SiC Microwave MESFETs*, 2000 8th IEEE International Symposium.

Hilton et al., *Surface Induced Instabilities in 4H-SiC Microwave MESFETs*, Materials Science Forum, vols. 338-342, 2000, pp. 1251-1254.

Jonsson et al., *Physical Simulations on the Operations of 4H-SiC Microwave Power Transistors*, Materials Science Forum, vols. 338-342, 2000, pp. 1263-1266.

Kelner et al., *β-SiC MESFET's and Buried-Gate JFET's*, IEEE Electron Device Letters, vol. EDL-8, No. 9, Sep. 1987, pp. 428-430.

Kong et al., *Temperature Dependence of the Current-Voltage Characteristics of Metal-Semiconductor Field-Effect Transistors in n-Type β -SiC Grown Via Chemical Vapor Deposition*, Appl. Phys Lett., vol. 51, No. 6, Aug. 10, 1987, pp. 442-444.

Konstantinov et al., High Performance Silicon Carbide MESFET Utilizing Lateral Epitaxy, *Materials Science Forum*, vols. 389-393, pp. 1375-1378.

Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.

Ma, et al., *High Efficiency LDMOS Power FET for Low Voltage Wireless Communications*, 1996 IEEE.

Nilsson et al., *Characterization of SiC MESFET's on Conducting Substrates*, Materials Science Forum, vols. 338-342, 2000, pp. 1255-1258.

Noblanc et al., *Power Density Comparison Between Microwave Power MESFET's Processed on Conductive and Semi-Insulating Wafer*, Materials Science Forum, vols. 338-342, 2000, pp. 1247-1250.

Palmour et al., *Characterization of Device Parameters in High-Temperature Metal-Oxide-Semiconductor Field Effect Transistors in β -SiC Thin Films*, J. Appl. Phys, vol. 64, No. 4, Aug. 15, 1988, pp. 2168-2177.

Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.

Palmour et al., *Ultrafast Silicon-Carbide Rectifiers*, Powertechnics Magazine, Aug. 1989, pp. 18-21.

Rorsman et al., *Fabrication, Characterization and Modeling of SiC MESFETs*, Materials Science Forum, vols. 338-342, 2000, pp. 12-59-1262.

*SiC MESFET Drives PCS Base Stations*, Wireless Systems Design, Oct. 1999, pp. 24.

Soares, ed., *GaAs MESFET Circuit Design*, Artech House, 1988, pp. 7-9, 17-18.

Sze, *Physics of Semiconductor Devices, Second Edition*, John Wiley & Sons, 1981, pp. 341-347.

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6.

International Search Report and Written Opinion of the International Searching Authority for International application No. PCT/US2005/035505, mailed Jul. 20, 2006.

\* cited by examiner

TRANSISTORS HAVING BURIED N-TYPE AND P-TYPE REGIONS BENEATH THE SOURCE REGION AND METHODS OF FABRICATING THE SAME

STATEMENT OF GOVERNMENT INTEREST

This invention was made with Government support. The Government has certain rights in this invention.

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Metal-semiconductor field effect transistors (MESFETs) have been developed for high frequency applications. The MESFET construction may be preferable for high frequency applications because only majority carriers carry current. The MESFET design may be preferred over MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the beyond, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities may be preferred for high frequency applications because the higher velocity translates to shorter times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

High frequency MESFETs may be manufactured of n-type III-V compounds, such as gallium arsenide (GaAs) because of their high electron mobilities. Although these devices provide increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, high power applications.

MESFETs having channel layers of silicon carbide have been produced on silicon substrates (See, e.g., U.S. Pat. No. 4,762,806 to Suzuki et al. and U.S. Pat. No. 4,757,028 to Kondoh et al.). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers that result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contacts formed on $n^+$ regions of SiC and an optional lightly doped epitaxial layer between the substrate and the n-type layer in which the channel is formed. U.S. Pat. No. 5,925,895 to Sriram et al. also describes a SiC MESFET and a structure that is described as overcoming "surface effects" which may reduce the performance of the MESFET for high frequency operation. Sriram et al. also describes SiC MESFETs that use n+ source and drain contact regions as well as a p-type buffer layer. SiC MESFETs are also discussed in U.S. Pat. No. 6,686,616 to Lipkin et al.

Furthermore, conventional SiC FET structures may provide constant characteristics during the entire operating range of the FET, i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled *Electronic Properties of Nitrogen Delta-Doped Silicon Carbide Layers*, MRS Fall Symposium, 2000 and an article by Konstantinov et al. entitled *Investigation of Lo-Hi-Lo and Delta Doped Silicon Carbide Structure*, MRS Fall Symposium, 2000. However, further improvements may be made in SiC MESFETs.

For example, it may be important that SiC MESFETs have high breakdown voltages and relatively low leakage currents if they are used in high efficiency, high power, high linearity radio frequency (RF) applications. In an attempt to provide high breakdown voltages, devices have been provided having highly compensated substrates, such as Vanadium doped semi-insulating SiC. These devices typically provide adequate breakdown voltages as well as low leakage currents, but may sacrifice device performance due to unwanted trapping effects in the substrate. Furthermore, devices having highly doped p-type layers under the channel of the FET have been provided and have been successful in providing good electron confinement and low leakage currents. However, these devices generally contain excessive parasitics that may degrade the RF performance of the device. Accordingly, further improvements may be made with respect to existing SiC FET devices such that they may provide improved breakdown voltages without sacrificing other performance characteristics of the device.

SUMMARY OF THE INVENTION

Some embodiments of the present invention provide a unit cell of a metal-semiconductor field-effect transistor (MESFET). The unit cell of the MESFET includes a MESFET including a source region, a drain region and a gate contact. The gate contact is between the source region and the drain region and on an n-type conductivity channel layer. A p-type conductivity region is provided beneath the source region and has an end that extends towards the drain region. The p-type conductivity region is spaced apart from the n-type conductivity channel layer and is electrically coupled to the source region. An n-type conductivity region is provided on the p-type conductivity region beneath the source region and extending toward the drain region without extending beyond the end of the p-type conductivity region.

In further embodiments of the present invention, the p-type conductivity region may include a first p-type conductivity region. The unit cell may further include a second p-type conductivity region having a carrier concentration that is less than a carrier concentration of the first p-type conductivity region. The second p-type conductivity region may extend from the end of the first p-type conductivity region to beneath the gate contact, such that the first and second p-type conductivity regions are provided on two surfaces of the n-type conductivity region. The gate contact may have a first sidewall and a second sidewall, the first sidewall being adjacent the source region and the second sidewall being adjacent the drain region. In certain embodiments of the present invention, the second p-type conductivity region may extend from the end of the first p-type conductivity region to the second sidewall of the gate contact without extending beyond the second sidewall of the gate contact or may extend from the end of the first p-type conductivity region to between the first and second sidewalls of the gate contact.

In still further embodiments of the present invention, a contact via hole may be provided adjacent the source region that exposes the p-type conductivity region. The n-type conductivity region may extend from the exposed portion of the p-type conductivity region without extending beyond the end of the p-type conductivity region. The MESFET may be provided on a substrate, such as a silicon carbide (SiC) substrate, and the n-type conductivity region may extend into the substrate. The n-type conductivity region may extend from about 500 Å to about 1500 Å into the substrate, but typically extends less than about 1000 Å into the substrate.

In some embodiments of the present invention, the MESFET may be provided on a buffer layer and the n-type conductivity region may extend into the buffer layer. The n-type conductivity region may extend from about 500 Å to about 1500 Å into the buffer layer, but typically extends less than about 1000 Å into the buffer layer. In certain embodiments of the present invention, the n-type conductivity region may be substantially depleted by the p-type region.

In some embodiments of the present invention, the gate contact may have a first sidewall and a second sidewall, the first sidewall being adjacent the source region and the second sidewall being adjacent the drain region. The n-type conductivity region may extend from beneath the source region to the first sidewall of the gate contact without extending beyond the first sidewall of the gate contact. In certain embodiments of the present invention, the n-type conductivity region may extend from beneath a source contact and/or the source region without extending to beneath a drain contact.

In further embodiments of the present invention, the substrate may be a silicon carbide (SiC) substrate and the p-type conductivity region may be disposed on the SiC substrate. The n-type conductivity channel layer may include n-type conductivity SiC, the p-type conductivity region may include p-type conductivity SiC and the n-type conductivity region may include n-type conductivity SiC.

In still further embodiments of the present invention, a substrate may be provided and the p-type conductivity region may be disposed on the substrate. The substrate may include gallium arsenide (GaAs) or gallium Nitride (GaN), the channel layer may be GaAs or GaN, the p-type conductivity region may be p-type conductivity GaAs or p-type conductivity GaN and the n-type conductivity region may be n-type conductivity GaAs or n-type conductivity GaN.

In some embodiments of the present invention, implanted n-type conductivity regions of SiC may be provided in the n-type conductivity channel layer that define the source region and the drain region having carrier concentrations greater than a carrier concentration of the n-type conductivity channel layer. The first and second ohmic contacts may be disposed on the source and drain regions, respectively. The gate contact may be disposed in the n-type channel layer. The gate contact may be disposed in a single or double recess in the n-type channel layer.

While the present invention is described above primarily with reference to MESFETs, other types of transistors as well as methods of fabricating transistors and, in particular, MESFETs are also provided.

DETAILED DESCRIPTION OF THE INVENTION

Figure 1:
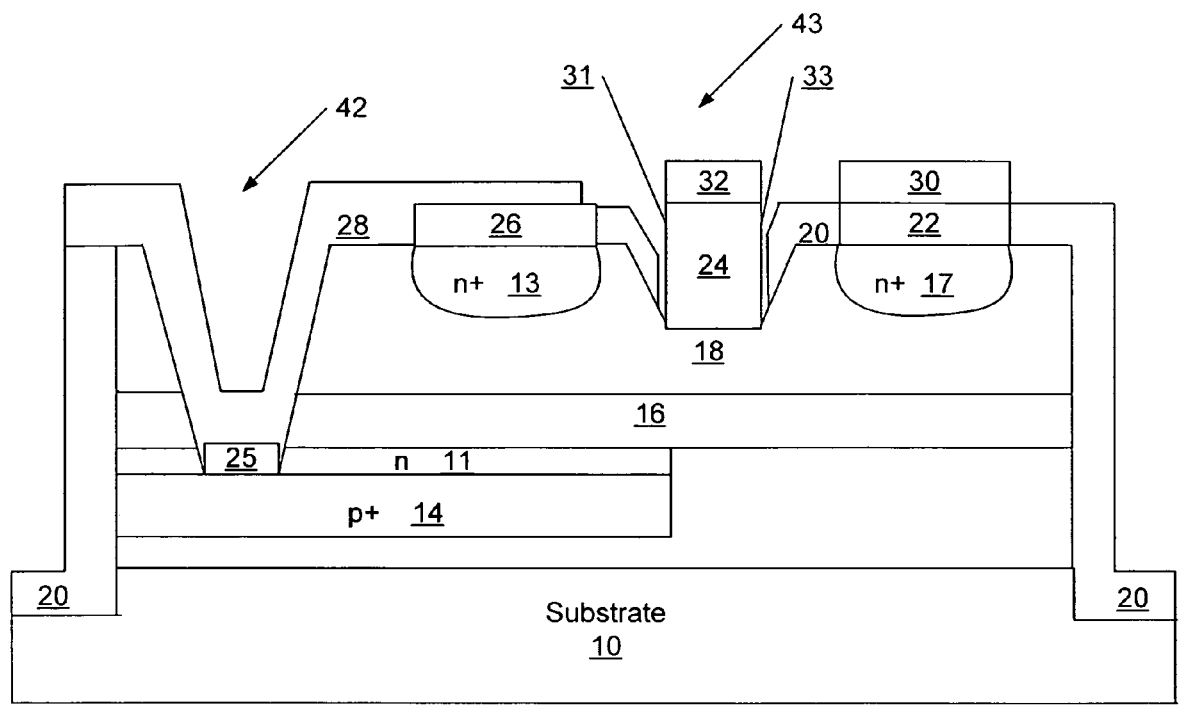
FIG. 1 is a cross-sectional view of a transistor according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 7 that illustrate various embodiments of the present invention and various processes of fabricating embodiments of the present invention. Transistors, for example, a metal-semiconductor field effect transistors (MESFETs) according to some embodiments of the present invention, may be provided having p-type conductivity regions beneath the source regions of the MESFET having ends that extend toward the drain regions of the MESFET. MESFETs having p-type conductivity regions beneath the source regions are discussed in commonly assigned United States Patent Application Publication No. 2004/0099888, filed on Nov. 26, 2003, entitled *Transistors Having Buried P-Type Layers Beneath The Source Region And Methods Of Fabricating The Same*, the disclosure of which is hereby incorporated herein by reference as if set forth in its entirety. As described therein, the presence of the buried p-type conductivity region may provide, for example, devices having improved breakdown voltages without compromising other performance characteristics of the device.

It is desirable to have the buried p-type conductivity region as close as possible to a channel region to reduce the amount of current flow through a buffer layer, to improve device efficiency and gain. However, placing the p-type conductivity region in close proximity to the channel may cause depletion in the channel under the gate contact as well as in the gate-source regions. Depletion in these areas may cause a reduction in device current and/or performance. Increasing a thickness of the channel may not be an adequate solution to this problem, as the breakdown voltage of the device may be lowered due to a higher charge density that may be present the gate-drain region caused by the increased thickness of the channel. Thus, some embodiments of the present invention, provide an n-type conductivity region on the p-type conductivity region between the p-type conductivity region and an n-type conductivity channel region. In certain embodiments of the present invention, the n-type conductivity region may be completely depleted by the $p^+$ region, i.e., is not conductive. The addition of the n-type conductivity region on the p-type conductivity region may selectively increase a thickness of the channel region beneath the source to gate region. Thus, the presence of the n-type conductivity region on the p-type conductivity region may reduce the likelihood of the occurrence of channel depletion when the p-type conductivity region is formed in close proximity to the channel region as discussed further herein.

As further discussed herein, transistors according to some embodiments of the present invention may be useful in, for example, high efficiency linear power amplifiers, such as power amplifiers for base stations using complex modulation schemes such as code division multiple access (CDMA) and/or Wideband CDMA (WCDMA).

Referring to FIG. 1, transistors, for example, MESFETs, according to embodiments of the present invention will now be described in detail. As seen in FIG. 1, a substrate 10 is provided. The substrate 10 may be a single crystal bulk silicon carbide (SiC) substrate of either p-type or n-type conductivity or semi-insulating. The substrate 10 of either p-type or n-type may be very lightly doped. The substrate may include 6H, 4H, 15R or 3C silicon carbide. Although the present invention is described herein with reference to a SiC substrate, the present invention should not be limited to SiC. For example, in some embodiments, the substrate 10 may also include, for example, gallium arsenide (GaAs) or Gallium Nitride (GaN) without departing from the scope of the present invention.

An optional buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $0.5 \times 10^{15}$ $cm^{-3}$ to about $3.0 \times 10^{15}$ $cm^{-3}$. Suitable dopants include aluminum, boron and/or gallium. The buffer layer 12 may have a thickness of about 2.0 µm. Although the buffer layer 12 is described above as p-type silicon carbide, the invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 is preferably less than about $5.0 \times 10^{14}$ $cm^{-3}$.

As further illustrated in FIG. 1, a $p^+$ region 14 is provided beneath a source region of the device that has an end that extends towards the drain region of the device. As used herein, "$p^+$" or "$n^+$" refer to regions that are defined by higher carrier concentrations than are present in adjacent or other regions of the same or another layer or substrate. Transistors having $p^+$ regions and methods of fabricating the same are discussed in as discussed herein are discussed in commonly assigned United States Patent Application Publication No. 2004/0099888, filed on Nov. 26, 2003 and, therefore, will not be discussed in detail herein.

Figure 3:
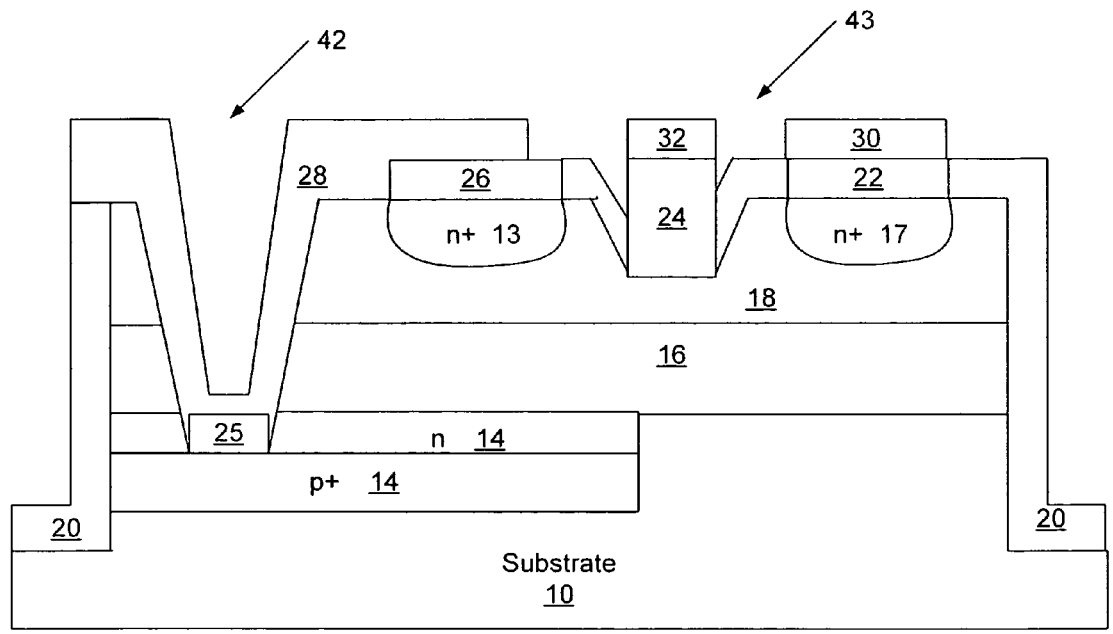
FIG. 3 is a cross-sectional view of a transistor according to further embodiments of the present invention.

The $p^+$ region 14 is a region of p-type conductivity, for example, p-type conductivity silicon carbide. For the $p^+$ region 14, carrier concentrations of from about $1.0 \times 10^{18}$ $cm^{-3}$ to about $1.0 \times 10^{20}$ $cm^{-3}$ may be suitable, but carrier concentrations as high as possible are preferred. The carrier concentration may not be constant throughout the $p^+$ region 14, but it is preferable that the carrier concentration be as high as possible at the surface of the $p^+$ region 14 to facilitate the formation of ohmic contacts thereon. In some embodiments of the present invention, the $p^+$ conductivity region 14 may be provided in the substrate 10 as illustrated in FIG. 3. The $p^+$ conductivity region 14 may, for example, extend about 0.4 µm into the buffer layer 12 or the substrate 10. The presence of the $p^+$ conductivity region 14 beneath the source region may inhibit electron injection from the source, thus, possibly providing an improved breakdown voltage. Furthermore, the fact that the $p^+$ conductivity region 14 does not extend to beneath the drain region may hinder the introduction of parasitics into the device and, thus, device performance may not be influenced.

As further illustrated in FIG. 1, an n-type conductivity region 11 is provided on the $p^+$ region 14. The n-type conductivity region 11 is provided beneath a source region 13 of the transistor and extends on the $p^+$ region 14 without extending beyond the end of the $p^+$ region 14 that extends towards the drain. In other words, in some embodiments of the present invention, the n-type conductivity region 11 may extend on the $p^+$ region 14 from a first end of the $p^+$ region 14 to a second end of the $p^+$ region 14 (the end that extends towards the drain). As used herein, the n-type conductivity region 11 extends beyond the $p^+$ region 14 if the $p^+$ region 14 no longer causes depletion of the n-type conductivity region 11. In some embodiments of the present invention, the n-type conductivity region 11 may be n-type conductivity SiC, for example, 6H, 4H, 15R or 3C polytype SiC. The n-type conductivity region 11 may extend from about 500 Å to about 1500 Å into the buffer layer 12 (if provided) or the substrate 10. In certain embodiments of the present invention, the n-type conductivity region 11 extends less than about 1000 Å into the buffer layer 12 or the substrate 10. As discussed above, the n-type conductivity region may be substantially depleted by the built in potential of the p-n junction. Thus, the substantially depleted n-type conductivity region 11 may selectively increase a thickness and conductivity of a channel region beneath the source to gate region. In some embodiments of the present invention the n-type conductivity region 11 may be completely depleted.

In some embodiments of the present invention, the n-type conductivity region 11 may further extend from beneath the source contact 26 and/or from beneath the $n^+$ source region 13 to the first sidewall 31 of the gate contact 24 without extending beyond the first sidewall 31 of the gate contact 24.

Figure 6:
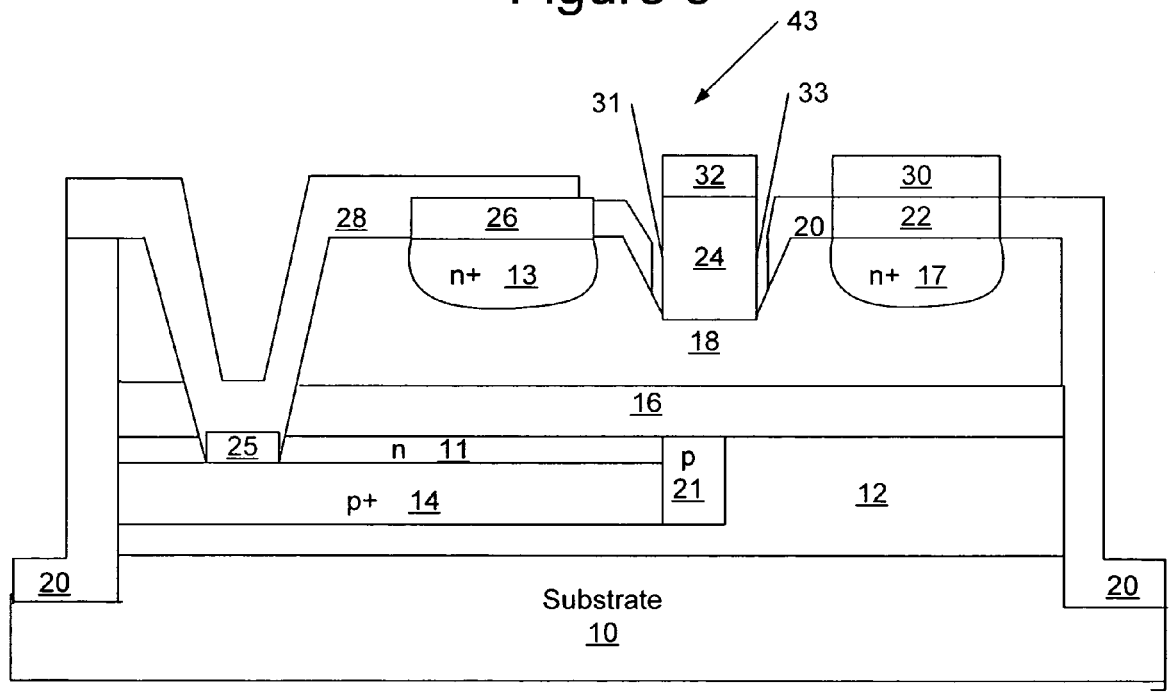
FIG. 6 is a cross-sectional view of a transistor according to further embodiments of the present invention.

In some embodiments of the present invention, a second p-type conductivity region 21 having a carrier concentration that is less than a carrier concentration of the first p-type conductivity region (p+ region) 14 may be provided as illustrated in FIG. 6. As illustrated therein, the second p-type conductivity region 21 may extend from an end of the first p-type conductivity region 14 to beneath the gate contact 24, such that the first and second p-type conductivity regions 14 and 21 are provided on two surfaces of the n-type conductivity region 11. As discussed above, the gate contact 24 has a first sidewall 31 and a second sidewall 33. The first sidewall 31 is adjacent the source region 13 and the second sidewall 33 is adjacent the drain region 17. The second p-type conductivity region 21 may extend from the end of the first p-type conductivity region 14 to the second sidewall 33 of the gate contact 24 without extending beyond the second sidewall of the gate contact or may extend from the end of the first p-type conductivity region 14 to between the first 31 and second 33 sidewalls of the gate contact 24. Typically, the second p-type conductivity region 21 extends about half way between the first 31 and second 33 sidewalls of the gate contact 24. In some embodiments of the present invention, the second p-type conductivity region 21 may be self aligned to the first p-type conductivity region 14.

Referring again to FIG. 1, the buffer layer 12 may be disposed between the substrate 10 and a second buffer layer 16. The second buffer layer 16 may be, for example, p-type silicon carbide having a carrier concentration of from about $1.0 \times 10^{15}$ cm$^{-3}$ to about $5 \times 10^{16}$ cm$^{-3}$. The p-type silicon carbide buffer layer 16 may also have a thickness of less than about 1000 Å. In some embodiments of the present invention, the buffer layer 16 may be omitted. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to buffer layer 12. In some embodiments of the present invention, the second buffer layer 16 may be provided directly on the substrate 10 as illustrated in FIG. 3.

Figure 4:
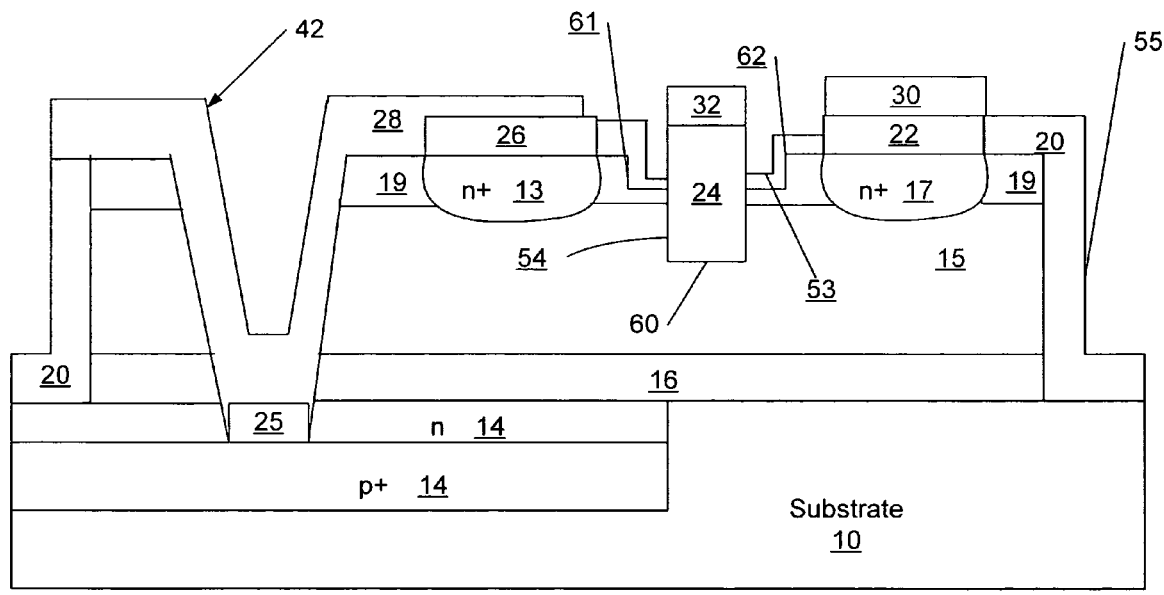
FIG. 4 is a cross-sectional view of a transistor according to still further embodiments of the present invention.

An n-type conductivity channel layer 18 is provided on the second buffer layer 16, as illustrated in FIG. 1. The n-type conductivity channel layer 18 may be formed of n-type conductivity silicon carbide of 6H, 4H, 15R or 3C polytype. The n-type conductivity channel layer may include one or more layers of, for example, n-type conductivity silicon carbide having different carrier concentrations. For example, the n-type conductivity channel layer 18 may include a first n-type conductivity channel layer 15 and a second n-type conductivity channel layer 19 as illustrated in FIG. 4. Alternatively, the n-type conductivity channel layer 18 may include first, second and third layers of n-type conductivity SiC a as discussed in detail in commonly assigned United States Patent Application Publication No. US 2003/0075719 to Sriram, filed on Oct. 24, 2001 entitled Delta Doped Silicon Carbide Metal-Semiconductor Field Effect Transistors Having a Gate Disposed in a Double Recess Structure, the disclosure of which is incorporated herein by reference as if set forth in its entirety.

As further illustrated in FIG. 1, n+ regions 13 and 17 are provided that respectively define the source region and the drain region of the device. The source and drain regions 13 and 17 are typically of n-type conductivity silicon carbide and have carrier concentrations that are greater than the carrier concentration of the n-type conductivity channel layer 18. For the source and drain regions 13 and 17, carrier concentrations of about $1 \times 10^{19}$ cm$^{-3}$ may be suitable, but carrier concentrations as high as possible are preferred.

Ohmic contacts 26 and 22 are provided on the implanted source and drain regions 13 and 17, respectively, and are spaced apart so as to provide the source contact 26 and the drain contact 22. Ohmic contact 25 is provided on the p+ conductivity region 14 to provide the p+ contact 25. The ohmic contacts 25, 26 and 22 may be formed of nickel or other suitable metals. The p+ conductivity region 14 is maintained at the same potential as the source region 13 by, for example, electrically coupling the p+ ohmic contact 25 to the source contact 26. An insulator layer 20, such as an oxide, may be further provided on the exposed surface of the device.

As further illustrated in FIG. 1, a first recess 43 and a contact via hole 42 are provided. The first recess 43 is provided between source and drain regions 13 and 17. The first recess 43 extends into the n-type conductivity channel layer 18 and exposes the n-type conductivity channel layer 18. The contact via hole 42 is provided adjacent the source region 13 and extends through the n-type conductivity region 11 to expose at least a portion of the p+ region 14. As discussed above, the n-type conductivity region 11 may extend on the p+ conductivity region 14 from one end of the p+ conductivity region 14 without extending beyond the second end of the p+ conductivity region 14 that extends towards the drain.

The gate contact 24 may be provided in the first recess 43 between the source region 13 and the drain region 17. The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the n-type conductivity channel layer 18. The gate contact 24 may further include an overlayer of platinum (Pt) and gold 32 or other highly conductive metal. Alternatively, the gate contact 24 may include a first layer of nickel in the first recess 43 on the n-type conductivity channel layer 18. The gate contact 24 may further include an overlayer on the first layer of nickel that includes a layer of gold.

As further illustrated in FIG. 1, metal overlayers 28, 30 and 32 may be provided on the source contact 26 and the p+ contact 25, the drain contact 22 and the gate contact 24, respectively. The overlayers 28, 30 and 32 may be gold, silver, aluminum, platinum and/or copper. Other suitable highly conductive metals may also be used for the overlayer. Furthermore, the metal overlayer 28 may electrically couple the p+ contact 25 of the p+ region 14 to the source contact 26.

Figure 2A:
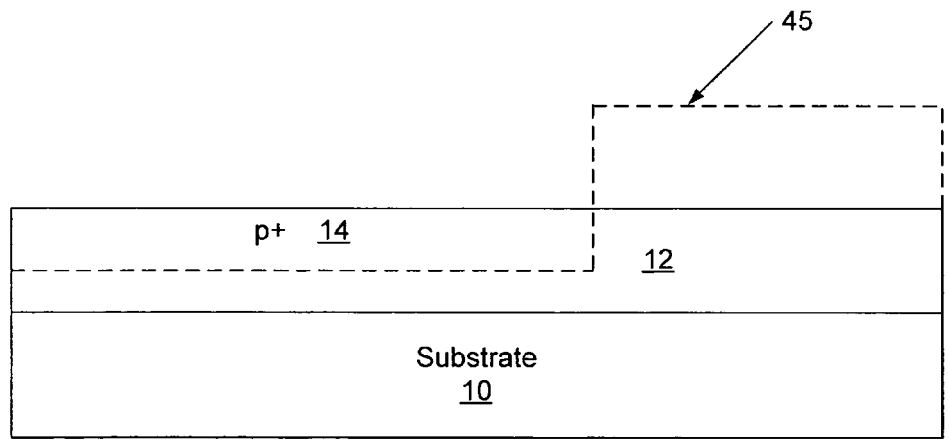
FIGS. 2A through 2H illustrate processing steps in the fabrication of transistors according to some embodiments of the present invention.

FIGS. 2A through 2H illustrate the fabrication of transistors according to some embodiments of the present invention. As seen in FIG. 2A, an optional buffer layer 12 may be grown or deposited on a substrate 10. The substrate 10 may be a semi-insulating substrate, a p-type substrate or an n-type substrate. The substrate 10 may be very lightly doped. If the substrate 10 is semi-insulating it may be fabricated as described in commonly assigned U.S. Pat. No. 6,218,680 to Carter et al. entitled "Semi-insulating Silicon Carbide Without Vanadium Domination", the disclosure of which is hereby incorporated by reference herein as if set forth in its entirety. Other techniques for providing semi-insulating substrates may also be used. The buffer layer 12 may be of p-type conductivity silicon carbide having a carrier concentration of about $3.0\times10^{15}$ cm$^{-3}$ or less, but typically $1.0\times10^{15}$ cm$^{-3}$ or less. Alternatively, the buffer layer 12 may be n-type silicon carbide or undoped silicon carbide.

Figure 2B:
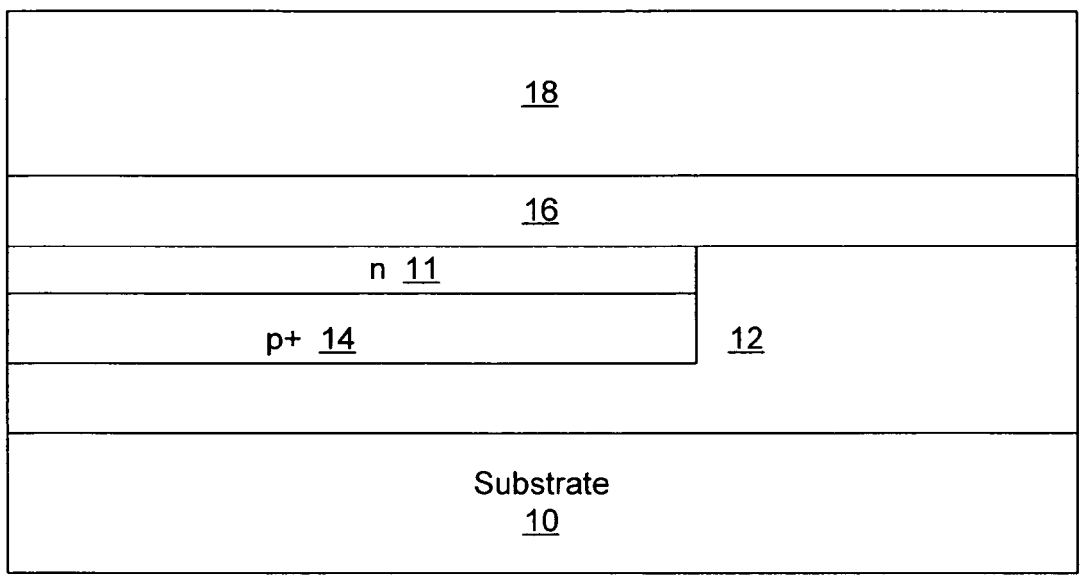

As further illustrated in FIG. 2A, a mask 45 may be formed for implanting the p$^+$ region 14. The p$^+$ region 14 is typically formed by ion implantation of, for example, aluminum, boron and/or gallium. The ion implantation may be performed on the regions that are not covered by the mask 45 to form p$^+$ region 14 as illustrated in FIG. 2B. Thus, the ions are implanted in portions of the buffer layer 12, if present, or the substrate 10, to provide a highly doped region of p-type conductivity, for example, p-type conductivity silicon carbide. The highly doped region of p-type conductivity may extend about 0.4 µm into the buffer layer 12 or the substrate 10. As still further illustrated in FIG. 2B, the mask 45 may also be used to implant the n-type conductivity region 11. The n-type conductivity region 11 is typically formed by ion implantation of, for example, nitrogen or phosphorus. The ion implantation may be performed on the region that is not covered by the mask 45 to form n-type conductivity region 11 as illustrated in FIG. 2B. The n-type conductivity region 11 may extend from about 500 Å to about 1500 Å into the buffer layer 12, if present, or the substrate 10, but typically extends less than about 1000 Å into the buffer layer 12, if present, or the substrate 10.

The implant of the p-type dopants and the n-type dopants are followed by a high temperature anneal to activate the implants. In some embodiments of the present invention, the n-type and p-type dopants may be annealed simultaneously. Suitable anneal temperatures may be from about 1300 to about 1600° C., typically about 1500° C.

As seen in FIG. 2B, a second buffer layer 16 and an n-type conductivity channel layer 18 are grown or deposited on the buffer layer 12. It will be understood that if the buffer layer 12 is not included, the second buffer layer 16 and the n-type conductivity channel layer 18 may be grown or deposited on the substrate 10. The second buffer layer 16 is formed on the buffer layer 12 and the n-type conductivity channel layer 18 is formed on the second buffer layer 16 as illustrated in FIG. 2B. The second buffer layer 16 is formed to have a thickness of less than about 1000 Å and may be omitted in some embodiments of the present invention as discussed above.

Figure 2C:
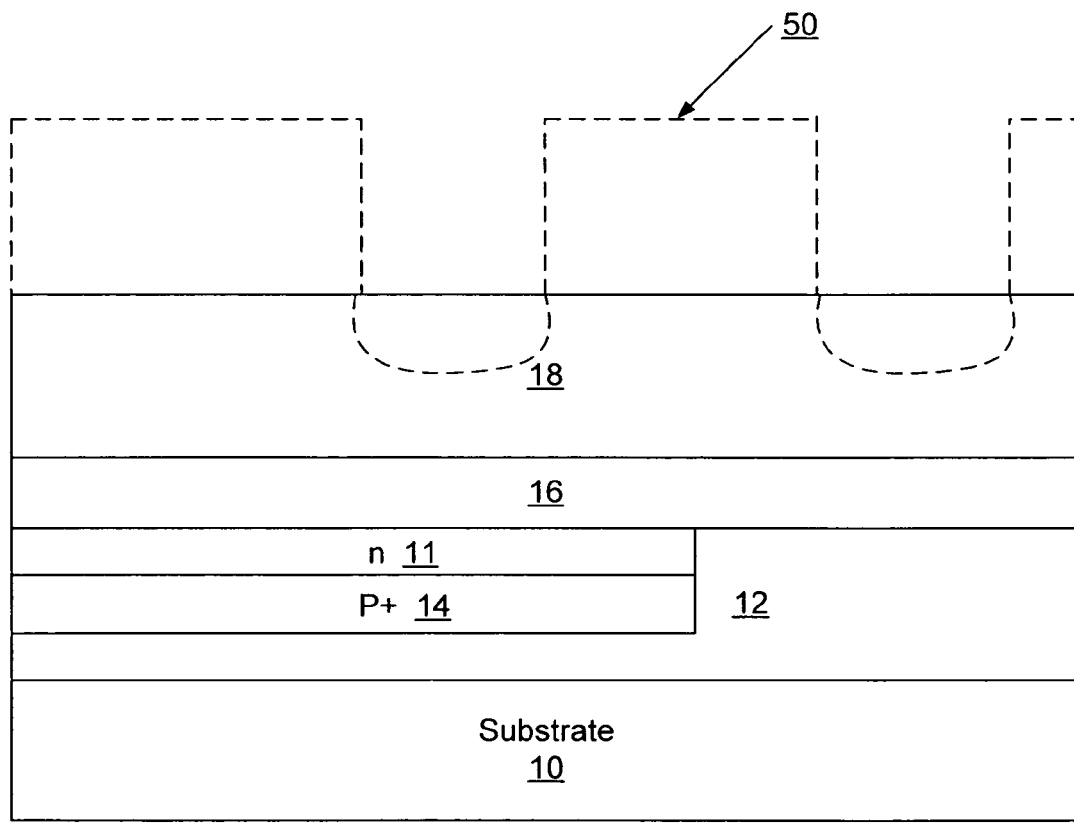
Figure 2D:
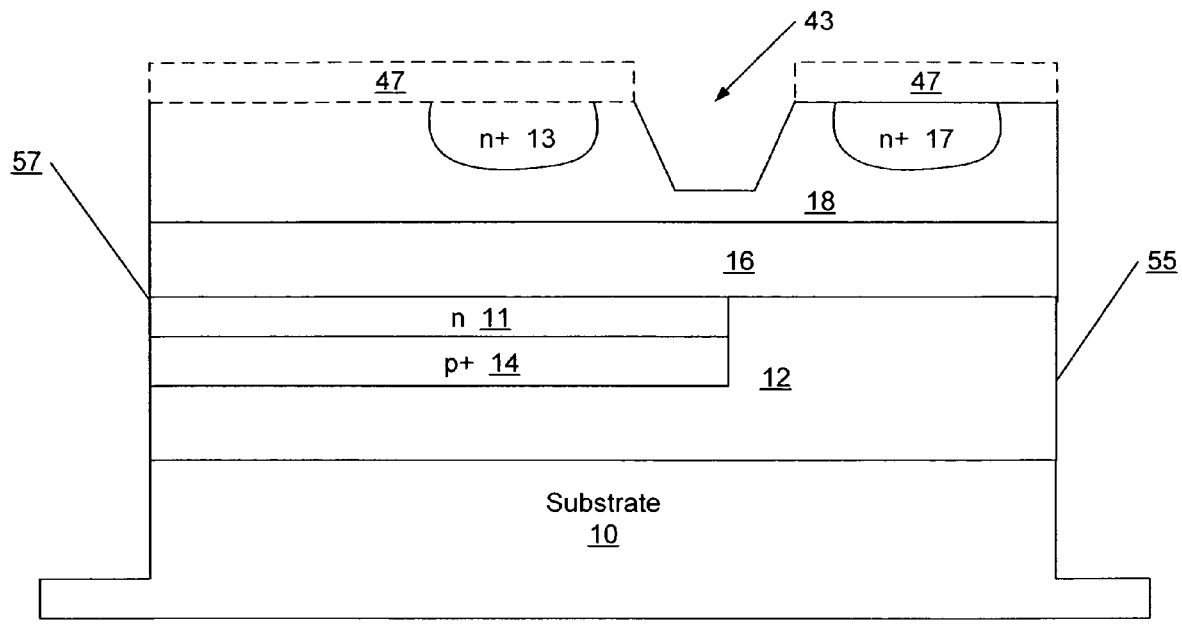

As illustrated in FIG. 2C, a mask 50 may be formed for implanting n$^+$ regions 13 and 17 that respectively define a source region and a drain region. The source and drain regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form n$^+$ regions 13 and 17 as illustrated in FIG. 2D. Thus, the ions are implanted in portions of the n-type conductivity channel layer 18 to provide highly doped regions of n-type conductivity, for example, n-type conductivity SiC, having higher carrier concentrations than the n-type conductivity channel layer 18. Once implanted, the dopants may be annealed to activate the implant.

As seen in FIG. 2D, the substrate 10, the buffer layer 12, the p$^+$ region 14, the second buffer layer 16 and the n-type conductivity channel layer 18 may be etched to form an isolation mesa. The mesa has sidewalls 55, 57 defined by the substrate 10, the buffer layer 12, the p$^+$ region 14, the second buffer layer 16 and the n-type conductivity channel layer 18 that define the periphery of the transistor. The sidewalls of the mesa extend downward past the p$^+$ conductivity region 14. The mesa may be formed to extend into the substrate 10 of the device as shown in FIG. 2D. The mesa may extend past the depletion region of the device to confine current flow in the device to the mesa and reduce the capacitance of the device. The mesa may be formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

In certain embodiments, only the second buffer layer 16 and the n-type conductivity channel layer 18 may be etched to form an isolation mesa as shown in FIG. 4. In these embodiments, the sidewalls 55, 57 are defined by the second buffer layer 16 and the n-type conductivity channel layer 18, which define the periphery of the transistor. It will be understood that the figures provided herein only describe exemplary embodiments of the isolation mesa and that embodiments of the present invention are not limited to those illustrated herein. For example, the isolation mesa may not extend into the second buffer layer 16 without departing from the scope of the present invention.

FIG. 2D further illustrates the formation of a first recess 43 of the MESFET. The first recess 43 may be formed by forming a mask 47 and then etching through the n-type conductivity channel layer 18 to form the first recess 43 according to the mask 47. The first recess 43 may be formed by an etching process, such as a dry or wet etch process. For example, the first recess 43 may be formed by dry etching, for example, Electron Cyclotron Resonance (ECR) or Inductively Coupled Plasma (ICP) etching. The mask 47 may be removed.

Figure 2E:
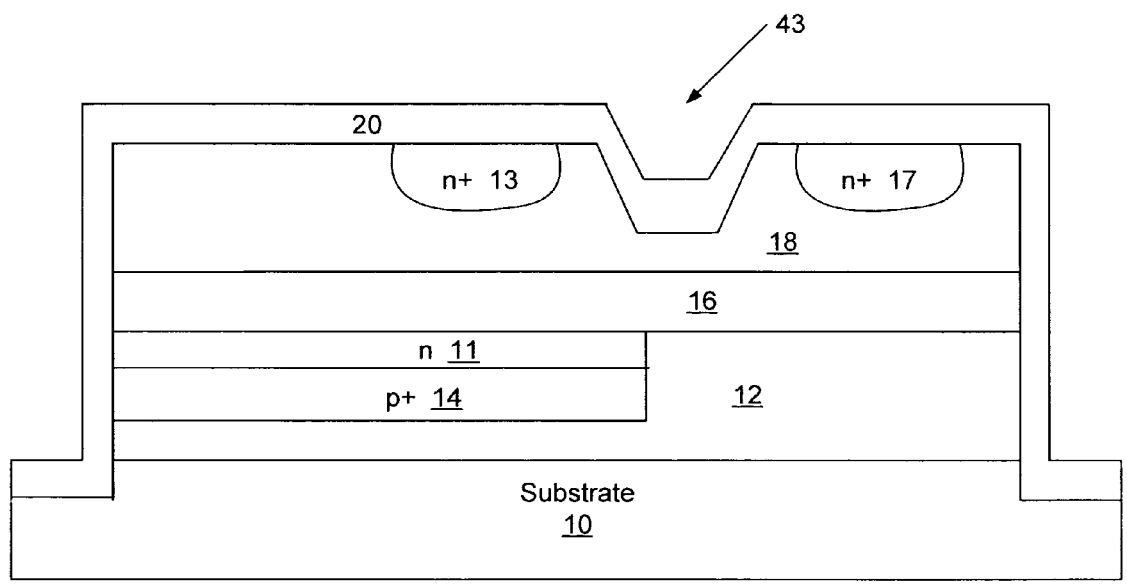

FIG. 2E illustrates the formation of an insulator layer 20, for example, an oxide layer, after the first recess 43 has been formed as discussed above. The insulator layer 20 may be grown or deposited over the exposed surface of the existing structure, i.e. on the isolation mesa, source and drain regions 13 and 17, the n-type conductivity channel layer 18 and in the first recess 43.

Figure 2F:
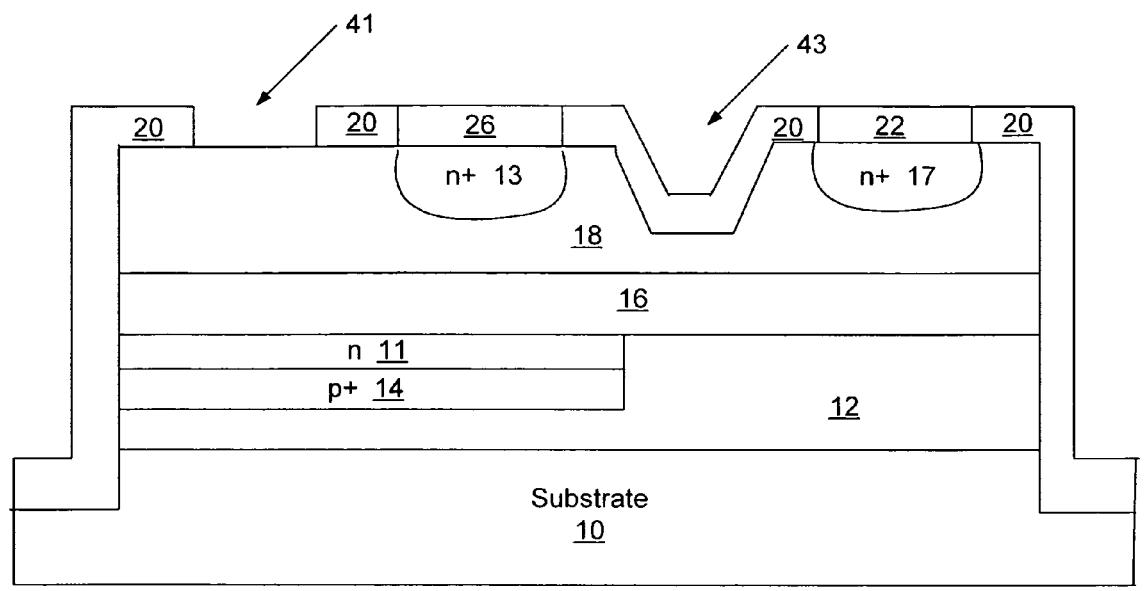

Referring now to FIG. 2F, contact windows may be etched through the insulator layer 20 to the source and drain regions 13 and 17. Nickel may then be evaporated to deposit the source and drain contacts 26 and 22, respectively. The nickel may be annealed to form the ohmic contacts 26 and 22 as illustrated in FIG. 2F. Such a deposition and annealing process may be carried out utilizing conventional techniques known to those of skill in the art. For example, the ohmic contacts 26 and 22 may be annealed at a temperature of from about 950° C. to about 1100° C. for about 2 minutes. However, other times and temperatures may also be utilized. Times from about 30 seconds to about 10 minutes may be, for example, acceptable. As further illustrated in FIG. 2G, after the source and drain contacts 26 and 22 are formed, a contact window 41 may be etched in the insulator layer 20 above the highly doped p$^+$ region 14.

In some embodiments of the present invention, the ohmic contacts may be the same or similar to contacts discussed in commonly assigned U.S. patent application Ser. No. 10/884,930, filed Jul. 6, 2004, entitled Silicon-Rich Nickel Silicide Ohmic Contacts for SiC Semiconductor Devices, the disclosure of which is incorporated herein by reference as if set forth in its entirety.

Figure 2G:
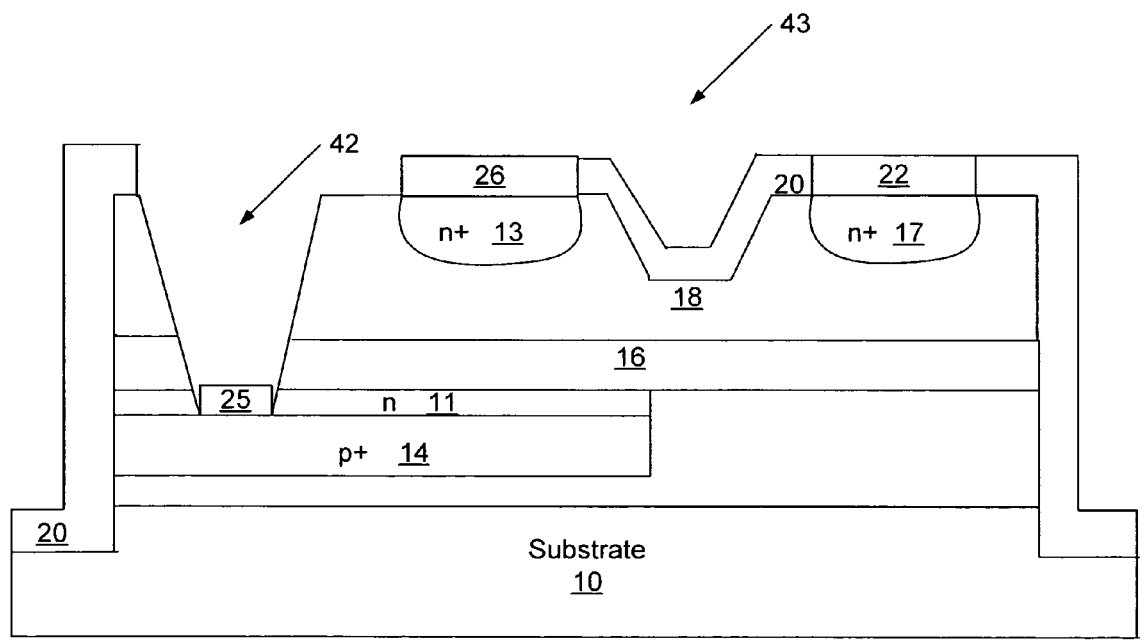

As illustrated in FIG. 2G, a contact via hole 42 of the MESFET may be formed. The contact via hole 42 may be etched in the portion of the MESFET defined by window 41 in the insulator layer 20. The n-type conductivity channel layer 18, the second buffer layer 16 (if present) and the n-type conductivity region 11 may be etched through to expose the p+ conductivity region 14 to form the contact via hole 42. The etching process may be, for example, a dry or wet etch process. As further illustrated in FIG. 2G, nickel and/or aluminum-titanium (AlTi) may be evaporated to deposit the p+ contact 25. The nickel may be annealed to form the ohmic contact 25. Such a deposition and annealing process may be carried out utilizing conventional techniques known to those of skill in the art. For example, the ohmic contact 25 may be annealed at a temperature of from about 600° C. to about 1050° C.

Figure 2H:
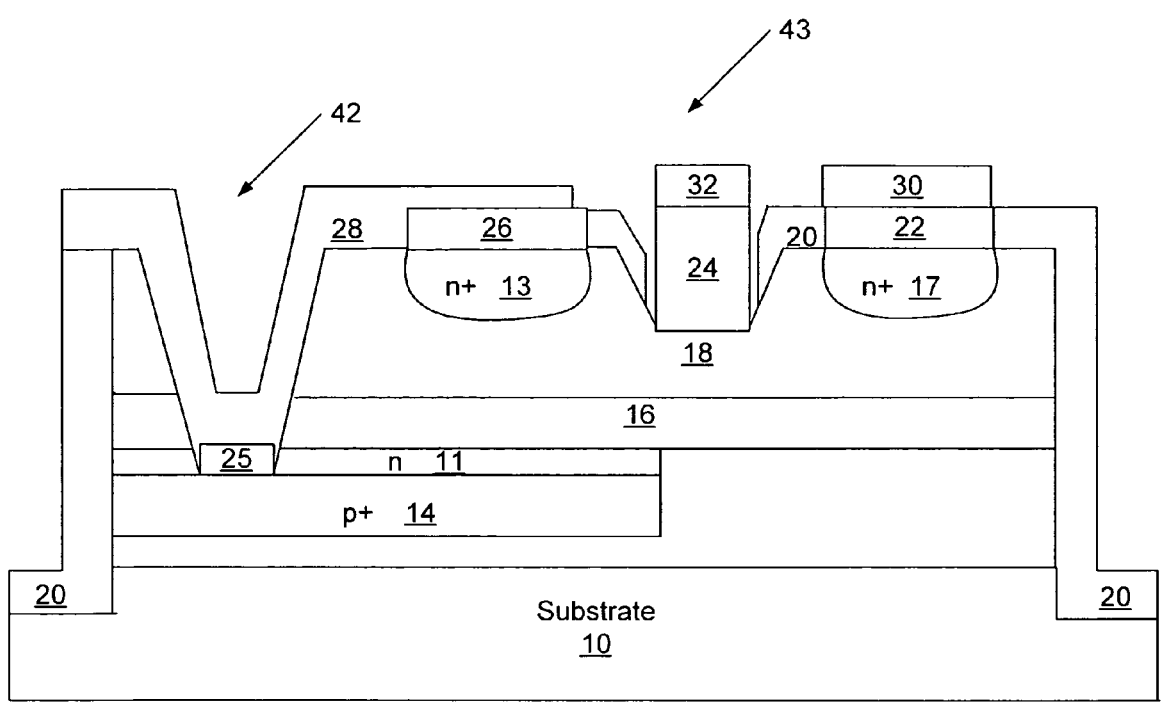

FIG. 2H illustrates the formation of the gate contact 24 and the overlayers 28, 30 and 32. For example, a window may be opened in the insulator 20 and a layer of chromium may be deposited in the first recess 43. Typically, the chromium layer is formed by evaporative deposition. The gate structure may then be completed by deposition of platinum and gold. As further illustrated, the source contact 26 and the p+ contact share a single overlayer 28, which electrically couples the source to the highly doped p-type conductivity region 14.

Referring now to FIG. 3, a cross-sectional view of a transistor according to further embodiments of the present invention will be discussed. Like numbers refer to like elements in previously described figures, thus, detailed descriptions of these elements will be omitted. As seen in FIG. 3, in some embodiments of the present invention, the p+ conductivity region 14 and the n-type conductivity region may be provided in the substrate 10.

Referring now to FIG. 4, a cross-sectional view of a transistor according to further embodiments of the present invention will be discussed. Like numbers refer to like elements in previously described figures, thus, detailed descriptions of these elements will be omitted. As seen in FIG. 4, some embodiments of the present invention may include a double recessed structure instead of the single recess 43. As illustrated in FIG. 4, a first recess 53 of the double recessed structure may be formed by forming a mask for the first recess 53 and etching through the first n-type conductivity channel layer 19 to form the first recess 53 according to the mask. An insulation layer may be formed after the first recess 53 has been formed. After forming the ohmic contacts as illustrated in FIG. 2F, a second recess 54 of the double recessed structure may be formed by forming a second mask for the second recess and etching the recess according to the mask. The second n-type conductivity channel layer 15 may be etched into a distance of, for example, about 600 Å to form the second recess 54. Methods of fabricating the double recessed structure are discussed further in commonly assigned U.S. patent application Ser. No. 10/136,456 to Sriram.

Figure 5:
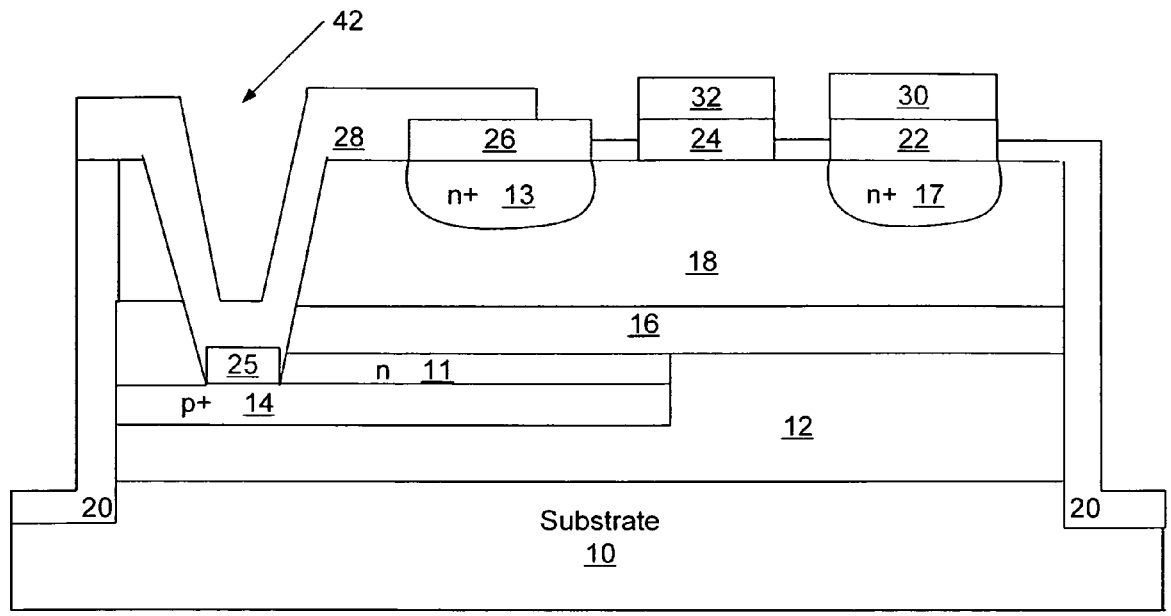
FIG. 5 is a cross-sectional view of a transistor according to some embodiments of the present invention.

Now referring to FIG. 5, a cross-sectional view of a MESFET according to still further embodiments of the present invention will be discussed. Like numbers refer to like elements in previously described figures, thus, descriptions of these elements will be omitted. As illustrated in FIG. 5, the gate contact 24 is disposed on the n-type conductivity channel layer 18 and is not disposed in a single or double recess.

Now referring to FIG. 6, a cross-sectional view of a MESFET according to some embodiments of the present invention will be discussed. Like numbers refer to like elements in previously described figures, thus, descriptions of these elements will be omitted. As illustrated in FIG. 6, a second p-type conductivity region 21 is provided having a carrier concentration that is less than a carrier concentration of the first p-type conductivity region (p+ region) 14 may be provided. As further illustrated therein, the second p-type conductivity region 21 may extend from an end of the first p-type conductivity region 14 to beneath the gate contact 24, such that the first and second p-type conductivity regions 14 and 21 are provided on two surfaces of the n-type conductivity region 11. As discussed above, the gate contact 24 has a first sidewall 31 and a second sidewall 33. The first sidewall 31 is adjacent the source region 13 and the second sidewall 33 is adjacent the drain region 17. The second p-type conductivity region 21 may extend from the end of the first p-type conductivity region 14 to the second sidewall 33 of the gate contact 24 without extending beyond the second sidewall of the gate contact or may extend from the end of the first p-type conductivity region 14 to between the first 31 and second 33 sidewalls of the gate contact 24. Typically, the second p-type conductivity region extends about half way between the first 31 and second 33 sidewalls of the gate contact 24.

Figure 7:
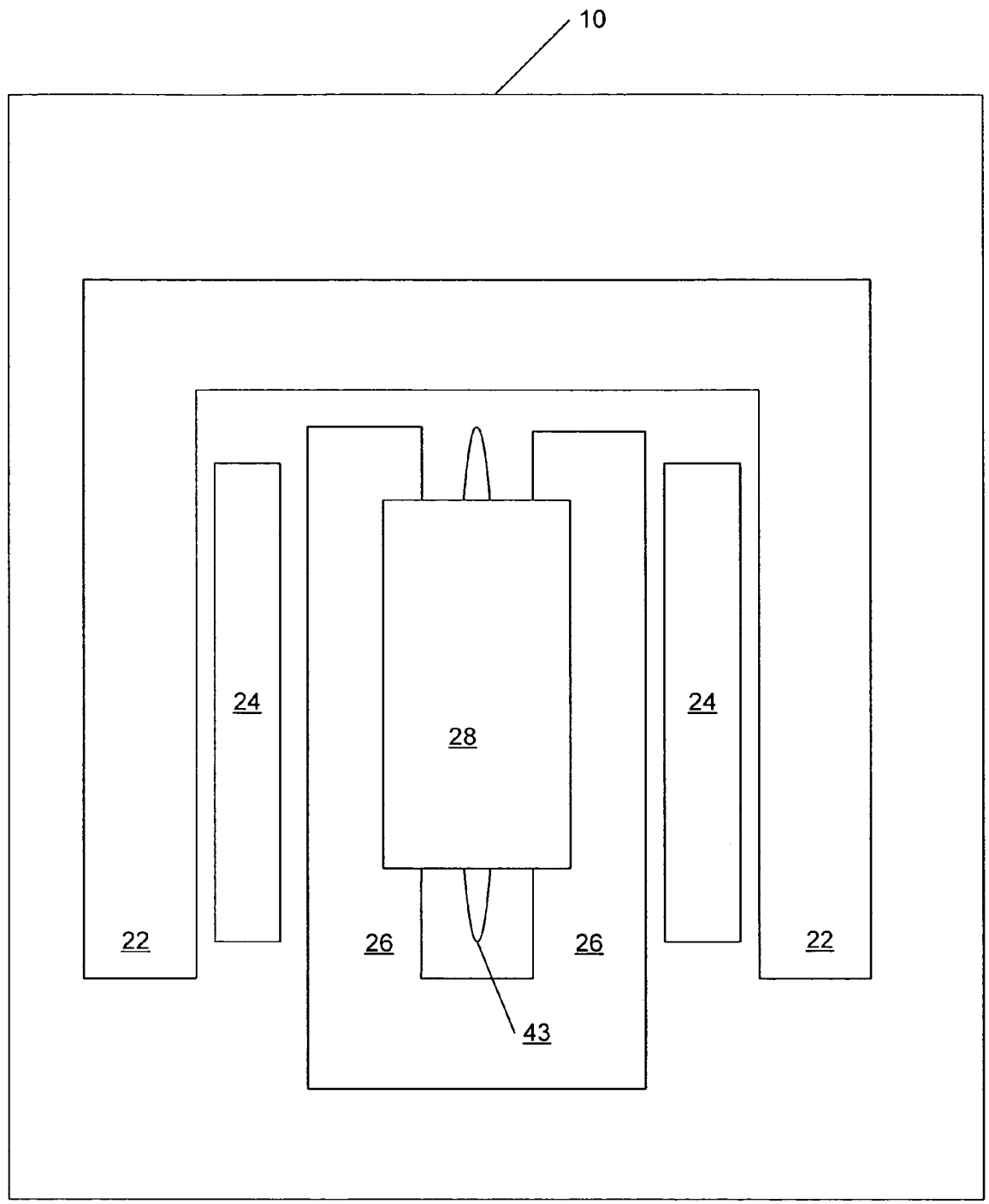
FIG. 7 is a plan view of a transistor according to some embodiments of the present invention.

Referring now to FIG. 7, a plan view (top view) of MESFETs according to certain embodiments of the present invention will be described. As illustrated in FIG. 7, a plurality of unit cells are provided on a substrate 10. A gate contact 24 is situated between a source contact 26 and a drain contact 22. As illustrated in FIG. 7, the source contacts 26 and drain contacts 22 are interdigitated. An overlayer 28 electrically couples the source contact 26 to a p+ region (not shown) via a p+ contact (not shown) that is disposed in the contact via hole 43.

Although the present invention is described above with respect to particular MESFETs having particular layers, regions and recesses, it will be understood that embodiments of the present invention are not limited to the above described MESFETs. A p-type and n-type conductivity regions beneath the source region of according to embodiments of the present invention may be incorporated in to other types of transistors. For example, the p-type conductivity region according to embodiments of the present invention may be incorporated into MESFETs described in commonly assigned U.S. Pat. No. 6,686,616 entitled Silicon Carbide Metal Semiconductor Field Effect Transistors to Allen et al., the disclosure of which is hereby incorporated herein by reference as if set forth in its entirety.

Although the present invention is described above with reference to SiC MESFETs, the present invention is not limited to SiC MESFETs. For example, MESFETs according to embodiments of the present invention may be, for example, gallium arsenide (GaAs) MESFETs or Gallium Nitride (GaN) MESFETs. In particular, if the present invention were described with respect to GaAs MESFETs, the p-type conductivity regions might be p-type conductivity GaAs regions, the n-type conductivity channel layers might be n-type conductivity GaAs layers and the like. Furthermore, MESFETs according to some embodiments of the present invention may be, for example, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising:
   a MESFET having a source region, a drain region and a gate contact, the gate contact being between the source region and the drain region and on an n-type conductivity channel layer;
   a p-type conductivity region beneath the source region and having an end that extends towards the drain region, the p-type conductivity region being spaced apart from the n-type conductivity channel layer and being electrically coupled to the source region; and
   an n-type conductivity region on the p-type conductivity region beneath the source region and extending toward the drain region without extending beyond the end of the p-type conductivity region,
   wherein the gate contact has a first sidewall and a second sidewall, the first sidewall being adjacent the source region and the second sidewall being adjacent the drain region; and
   wherein the n-type conductivity region extends from beneath the source region to the first sidewall of the gate contact without extending beyond the first sidewall of the gate contact.

2. The unit cell of claim 1, further comprising a buffer layer, wherein the MESFET is provided on the buffer layer and wherein the n-type conductivity region extends into the buffer layer.

3. The unit cell of claim 2, wherein the n-type conductivity region extends from about 500 Å to about 1500 Å into the buffer layer.

4. The unit cell of claim 3, wherein the n-type conductivity region extends into the buffer layer less than about 1000 Å.

5. The unit cell of claim 1, wherein the n-type conductivity region is substantially depleted by the p-type conductivity region.

6. The unit cell of claim 1, further comprising a silicon carbide (SiC) substrate, the p-type conductivity region being disposed on the SiC substrate, wherein the n-type conductivity channel layer comprises n-type conductivity SiC, wherein the p-type conductivity region comprises p-type conductivity SiC and wherein the n-type conductivity region comprises n-type conductivity SiC.

7. The unit cell of claim 1, further comprising a substrate, the p-type conductivity region being disposed on the substrate, wherein the substrate comprises gallium arsenide (GaAs) or gallium Nitride (GaN), wherein the channel layer comprises GaAs or GaN, wherein the p-type conductivity region comprises p-type conductivity GaAs or p-type conductivity GaN and wherein the n-type conductivity region comprises n-type conductivity GaAs or n-type conductivity GaN.

8. The unit cell of claim 1, further comprising implanted n-type conductivity regions of SiC in the n-type conductivity channel layer that define the source region and the drain region having carrier concentrations greater than a carrier concentration of the n-type conductivity channel layer, wherein first and second ohmic contacts are disposed on the source and drain regions, respectively.

9. The unit cell of claim 1, wherein the gate contact is disposed in the n-type channel layer.

10. The unit cell of claim 9, wherein the gate contact is disposed in a single recess in the n-type channel layer.

11. The unit cell of claim 9, wherein the gate contact is disposed in a double recess in the n-type channel layer.

12. The unit cell of claim 1, further comprising a substrate, wherein the MESFET is on the substrate and wherein the n-type conductivity region extends into the substrate.

13. The unit cell of claim 12, wherein the n-type conductivity region extends from about 500 Å to about 1500 Å into the substrate.

14. The unit cell of claim 13, wherein the n-type conductivity region extends into the substrate less than about 1000 Å.

15. The unit cell of claim 12, wherein the substrate comprises a silicon carbide (SIC) substrate.

16. A unit cell of a metal-semiconductor field-effect transistor (MESFET), comprising:
   a MESFET having a source region, a drain region and a gate contact, the gate contact being between the source region and the drain region and on an n-type conductivity channel layer;
   a p-type conductivity region beneath the source region and having an end that extends towards the drain region, the p-type conductivity region being spaced apart from the n-type conductivity channel layer and being electrically coupled to the source region; and
   an n-type conductivity region on the p-type conductivity region beneath the source region and extending toward the drain region without extending beyond the end of the p-type conductivity region, wherein the p-type conductivity region comprises a first p-type conductivity region, the unit cell further comprising a second p-type conductivity region, having a carrier concentration that is less than a carrier concentration of the first p-type conductivity region, that extends from the end of the first p-type conductivity region to beneath the gate contact, such that the first and second p-type conductivity regions are provided on two surfaces of the n-type conductivity region.

17. The unit cell of claim 16:
   wherein the gate contact has a first sidewall and a second sidewall, the first sidewall being adjacent the source region and the second sidewall being adjacent the drain region; and
   wherein the second p-type conductivity region extends from the end of the first p-type conductivity region to the second sidewall of the gate contact without extending beyond the second sidewall of the gate contact.

18. The unit cell of claim 16:
   wherein the gate contact has a first sidewall and a second sidewall, the first sidewall being adjacent the source region and the second sidewall being adjacent the drain region; and
   wherein the second p-type conductivity region extends from the end of the first p-type conductivity region to between the first and second sidewalls of the gate contact.

19. A unit cell of a metal-semiconductor field-effect transistor (MESFET), comprising:
   a MESFET having a source region, a drain region and a gate contact, the gate contact being between the source region and the drain region and on an n-type conductivity channel layer;
   a p-type conductivity region beneath the source region and having an end that extends towards the drain region, the p-type conductivity region being spaced apart from the n-type conductivity channel layer and being electrically coupled to the source region;
   an n-type conductivity region on the p-type conductivity region beneath the source region and extending toward the drain region without extending beyond the end of the p-type conductivity region; and a contact via hole adjacent the source region that exposes the p-type conductivity region, wherein the n-type conductivity region extends from the exposed portion of the p-type conductivity region without extending beyond the end of the p-type conductivity region.

20. A unit cell of a metal-semiconductor field-effect transistor (MESFET), comprising:

a silicon carbide (SiC) MESFET having a source region, a drain region and a gate contact, the gate contact being between the source region and the drain region and on a channel layer of n-type conductivity SiC;

a p-type conductivity SiC region beneath the source region and having an end that extends towards the drain region, the p-type conductivity SiC region being spaced apart from the n-type conductivity SiC channel layer and being electrically coupled to the source region; and an n-type conductivity SiC region on the p-type conductivity SiC region beneath the source region and extending toward the drain region without extending beyond the end of the p-type conductivity SiC region, wherein the gate contact has a first sidewall and a second sidewall, the first sidewall being adjacent the source region and the second sidewall being adjacent the drain region; and wherein the n-type conductivity SiC region extends from beneath the source region to the first sidewall of the gate contact without extending beyond the first sidewall of the gate contact.

21. A method of forming a metal-semiconductor field-effect transistor (MESFET), comprising:

forming a MESFET having a source region, a drain region and a gate contact, the gate contact being between the source region and the drain region and on an n-type conductivity channel layer;

forming a p-type conductivity region beneath the source region and having an end that extends towards the drain region, the p-type conductivity region being spaced apart from the n-type conductivity channel layer and being electrically coupled to the source region; and forming an n-type conductivity region on the p-type conductivity region beneath the source region and extending toward the drain region without extending beyond the end of the p-type conductivity region, wherein the gate contact has a first sidewall and a second sidewall, the first sidewall being adjacent the source region and the second sidewall being adjacent the drain region; and wherein forming the n-type conductivity region comprises forming the n-type conductivity region extending from beneath the source region to the first sidewall of the gate contact without extending beyond the first sidewall of the gate contact.

22. The method of claim 21, wherein forming the MESFET further comprising forming the MESFET on a buffer layer and wherein forming the n-type conductivity region comprises forming the n-type conductivity region extending into the buffer layer.

23. The method of claim 22, wherein the n-type conductivity region extends from about 500 Å to about 1500 Å into the buffer layer.

24. The method of claim 23, wherein the n-type conductivity region extends into the buffer layer less than about 1000 Å.

25. The method of claim 21, wherein the n-type conductivity region is substantially depleted by the p-type conductivity region.

26. The method of claim 21, further comprising forming a silicon carbide (SiC) substrate, wherein forming the p-type conductivity region comprises forming the p-type conductivity region on the SiC substrate, wherein forming the n-type conductivity channel layer comprises forming an n-type conductivity SiC channel layer, wherein forming the p-type conductivity region comprises forming a p-type conductivity SiC region and wherein forming the n-type conductivity region comprises forming an n-type conductivity SiC region.

27. The method of claim 21, further comprising forming a substrate, wherein forming the p-type conductivity region comprises forming the p-type conductivity region on the substrate, wherein the substrate comprises gallium arsenide (GaAs) or gallium Nitride (GaN), wherein the channel layer comprises of GaAs or GaN, wherein the p-type conductivity region comprises of p-type conductivity GaAs or p-type conductivity GaN and wherein the n-type conductivity region comprises of n-type conductivity GaAs or n-type conductivity GaN.

28. The method of claim 21, further comprising:

forming implanted n-type conductivity regions of SiC in the n-type conductivity channel layer that define the source region and the drain region having carrier concentrations greater than a carrier concentration of the n-type conductivity channel layer; and forming first and second ohmic contacts on the source and drain regions, respectively.

29. The method of claim 21, wherein the gate contact is disposed in the n-type channel layer.

30. The method of claim 29, wherein the gate contact is disposed in a single recess in the n-type channel layer.

31. The method of claim 29, wherein the gate contact is disposed in a double recess in the n-type channel layer.

32. The method of claim 21, wherein forming the MESFET comprises forming the MESFET on a substrate and forming the n-type conductivity region comprises forming the n-type conductivity region extending into the substrate.

33. The method of claim 32, wherein the n-type conductivity region extends from about 500 Å into the substrate.

34. The method of claim 33, wherein the n-type conductivity region extends into the substrate less than about 1000 Å.

35. The method of claim 32, wherein the substrate comprises a silicon carbide (SIC) substrate.

36. A method of forming a metal-semiconductor field-effect transistor (MESFET), comprising:

forming a MESFET having a source region, a drain region and a gate contact, the gate contact being between the source region and the drain region and on an n-type conductivity channel layer;

forming a p-type conductivity region beneath the source region and having an end that extends towards the drain region, the p-type conductivity region being spaced apart from the n-type conductivity channel layer and being electrically coupled to the source region; and forming an n-type conductivity region on the p-type conductivity region beneath the source region and extending toward the drain region without extending beyond the end of the p-type conductivity region, wherein forming the p-type conductivity region comprises forming a first p-type conductivity region, the method further comprising forming a second p-type conductivity region, having a carrier concentration that is less than a carrier concentration of the first p-type conductivity region, that extends from the end of the first p-type conductivity region to beneath the gate contact, such that the first and second p-type conductivity regions are provided on two surfaces of the n-type conductivity region.

37. The method of claim 36:
wherein the gate contact has a first sidewall and a second sidewall, the first sidewall being adjacent the source region and the second sidewall being adjacent the drain region; and
wherein the second p-type conductivity region extends from the end of the first p-type conductivity region to the second sidewall of the gate contact without extending beyond the second sidewall of the gate contact.

38. The method of claim 36:
wherein the gate contact has a first sidewall and a second sidewall, the first sidewall being adjacent the source region and the second sidewall being adjacent the drain region; and
wherein the second p-type conductivity region extends from the end of the first p-type conductivity region to between the first and second sidewalls of the gate contact.

39. A method of forming a metal-semiconductor field-effect transistor (MESFET), comprising:
forming a MESFET having a source region, a drain region and a gate contact, the gate contact being between the source region and the drain region and on an n-type conductivity channel layer;
forming a p-type conductivity region beneath the source region and having an end that extends towards the drain region, the p-type conductivity region being spaced apart from the n-type conductivity channel layer and being electrically coupled to the source region;
forming an n-type conductivity region on the p-type conductivity region beneath the source region and extending toward the drain region without extending beyond the end of the p-type conductivity region; and
forming a contact via hole adjacent the source region that exposes the p-type conductivity region, wherein the n-type conductivity region extends from the exposed portion of the p-type conductivity region without extending beyond the end of the p-type conductivity region.

40. A unit cell of a transistor, comprising:
a transistor having a source region, a drain region and a gate contact, the gate contact being between the source region and the drain region and on an n-type conductivity channel layer;
a p-type conductivity region beneath the source region and having an end that extends towards the drain region, the p-type conductivity region being spaced apart from the n-type conductivity channel layer and being electrically coupled to the source region;
an n-type conductivity region extending on the p-type conductivity region beneath the source region and extending toward the drain region without extending beyond the end of the p-type conductivity region; and
a contact via hole adjacent the source region that exposes the p-type conductivity region, wherein the n-type conductivity region extends from the exposed portion of the p-type conductivity region without extending beyond the end of the p-type conductivity region.

41. The unit cell of claim 40, wherein the transistor is provided on a buffer layer and wherein the n-type conductivity region extends into the buffer layer.

42. The unit cell of claim 41, wherein the n-type conductivity region extends from about 500 Å to about 1500 Å into the buffer layer.

43. The unit cell of claim 42, wherein the n-type conductivity region extends into the buffer layer less than about 1000 Å.

44. The unit cell of claim 40, wherein the n-type conductivity region is substantially depleted.

45. The unit cell of claim 40, wherein the transistor is on a substrate and wherein the n-type conductivity region extends into the substrate.

46. The unit cell of claim 45, wherein the n-type conductivity region extends from about 500 Å to about 1500 Å into the substrate.

47. The unit cell of claim 46, wherein the n-type conductivity region extends into the substrate less than about 1000 Å.

48. The unit cell of claim 45, wherein the substrate comprises a silicon carbide (SIC) substrate.

* * * * *

UNITED STATES PATENT AND TRADEMARK OFFICE
CERTIFICATE OF CORRECTION

PATENT NO. : 7,326,962 B2  
APPLICATION NO. : 11/012553  
DATED : February 5, 2008  
INVENTOR(S) : Sriram Page 1 of 1

It is certified that error appears in the above-identified patent and that said Letters Patent is hereby corrected as shown below:

On the Title Page:

Item 56, Foreign Patent Documents: Please add the following references:
-- JP 1-106477   Suga et al.   03-07-1989
PCT WO 01/67521   09-13-2001 --

Signed and Sealed this

Twenty-seventh Day of May, 2008

JON W. DUDAS  
*Director of the United States Patent and Trademark Office*